United States Patent [19]

Schwartz

[11] 3,713,912

[45] Jan. 30, 1973

[54] GALLIUM ARSENIDE FIELD EFFECT STRUCTURE

[75] Inventor: Bertram Schwartz, Westfield, N.J.

[73] Assignee: Bell Telephone Laboratories, Incorporated, Murray Hill, N.J.

[22] Filed: Feb. 11, 1971

[21] Appl. No.: 114,551

[52] U.S. Cl. ....................148/187, 148/1.5, 148/188, 317/235 B

[51] Int. Cl. ....................H01l 7/44

[58] Field of Search ...............148/1.5, DIG. 187, 188

[56] References Cited

UNITED STATES PATENTS

| | | | |
|---|---|---|---|
| 3,507,709 | 4/1970 | Bower | 148/1.5 |
| 3,576,478 | 4/1971 | Watkins et al. | 148/175 X |

FOREIGN PATENTS OR APPLICATIONS

| | | | |
|---|---|---|---|
| 1,140,579 | 1/1969 | Great Britain | 148/188 |

OTHER PUBLICATIONS

Lehman, "Chemical and Ambient Effects on Surface Conduction–etc.,'IBM Journal, September 1964, pp. 422–426.

*Primary Examiner*—L. Dewayne Rutledge
*Assistant Examiner*—J. M. Davis
*Attorney*—R. J. Guenther, Edwin B. Cave and R. J. Guenther

[57] ABSTRACT

A technique is described for the fabrication of a self-registered gallium arsenide field effect structure including at least one semi-insulating surface layer. The technique involves forming a semi-insulating layer including a surface coating on a conductive material upon the surface of n-type gallium arsenide, generating a pair of windows in such layer and introducing either a p-type or n-type material through the windows.

3 Claims, 5 Drawing Figures

INVENTOR
B. SCHWARTZ
BY Edward M. Fink
ATTORNEY

GALLIUM ARSENIDE FIELD EFFECT STRUCTURE

Field of the Invention

This invention relates to field effect devices. More particularly, the present invention relates to a self-registered gallium arsenide field effect structure including at least one semi-insulating surface layer.

DESCRIPTION OF THE PRIOR ART

The field effect device has been known for several decades and typically includes a semiconductive material in which the current flow characteristics of charge carriers can be influenced by the application of an externally applied field. Among the more popular of such devices is the field effect transistor which is a semiconductive device including a conducting channel of a semiconductive material intermediate a pair of ohmic contacts designated as the source and drain, respectively. The number of charge carriers available to carry current in the conducting channel of the device is controlled by the application of an electric field to the surface of the semiconductive material by means of a charged gate. This end may be attained in either of two well-known means, namely, the insulated gate and the junction gate.

Although the field effect transistor (FET) was discovered more than 20 years ago, its significance has been overshadowed by the bipolar transistor which absorbed the bulk of the technological interest in the years that followed. However, workers in the art have recently refocused their interest on the field effect transistor. Among the more prominent materials considered for such applications is gallium arsenide, which offers greater electron mobility, higher power capabilities and lower noise characteristics than most semiconductive materials.

Unfortunately, gallium arsenide FET structures, particularly of the insulated gate variety, are difficult to fabricate and require a series of process steps to attain mask re-registration, a major problem heretofore having been the inability to overcome the fact that externally applied dielectrics, which are not indigenous to the system, have been required. Furthermore, such devices rely upon the use of a junction which is at the crystallographic surface of the semiconductor, so requiring that contaminants of a polar nature be eliminated or precluded from forming on the surface of the semiconductive material.

Another field effect device which has recently generated interest is the field influenced transferred electron oscillator in which the effective bulk of the material where the electron flow is taking place is modified by externally applied fields which influence the form of the output signal.

SUMMARY OF THE INVENTION

In accordance with the present invention, a technique is described for the fabrication of a self-registered gallium arsenide field effect structure including at least one semi-insulating surface layer. The technique involves forming a semi-insulating layer including a surface coating of a conductive material upon the surface of n-type gallium arsenide, generating a pair of windows in such layer and introducing either a p-type or n-type material through the windows, so resulting in the formation of either an insulated gate field effect transistor (IGFET) or a field effect transferred electron oscillator (FETEO).

BRIEF DESCRIPTION OF THE DRAWING

The invention will be more readily understood by reference to the following detailed description taken in conjunction with the following drawing wherein.

DETAILED DESCRIPTION

Figure 1:
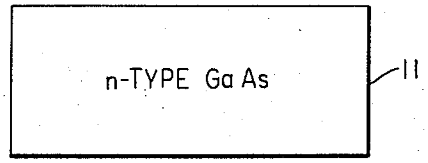
FIG. 1 is a front elevational view in cross section of a sample of n-type gallium arsenide amenable to processing in accordance with the present invention.

With reference now to FIG. 1 there is shown in cross-sectional view a sample of n-type gallium arsenide 11, typically having a carrier concentration within the range of $10^{14}$ to $10^{18}$ free carriers per cubic centimeter and a bandgap within the range of 1 to 2.5 electron volts. The gallium arsenide selected for use herein is typically obtained from commercial sources and may be grown by any of the well-known procedures as, for example, floating zone techniques, the Bridgman technique, et cetera.

Figure 2:
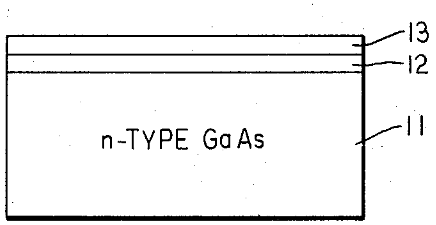
FIG. 2 is a cross-sectional view of the structure of FIG. 1 after the formation therein of a semi-insulating layer including a surface coating of a conductive material.

The gallium arsenide so obtained is initially cut into the desired size, lapped, etched and polished in accordance with conventional procedures. Thereafter, a material capable of generating a deep center and high resistivity ($10^5$ to $10^8$ ohm-centimeters) in the gallium arsenide is introduced into the crystal. This end may conveniently be attained by (1) electroplating the material on to the major surfaces of the sample, (2) by vapor transport techniques, or (3) by vacuum deposition of thin films of the order of 2,000 A in thickness and subsequent heating to effect diffusion. The thickness of the film deposited pursuant to the foregoing techniques may range from 1,000 A to 5,000 A, dependent upon the depth of the semi-insulating layer desired and the amount of material it is desired to retain on the surface of the semiconductive material, minima and maxima being dictated by practical considerations. In order to fabricate the field effect device, as described herein, it will be understood that it is absolutely essential that the remaining material on the surface of the gallium arsenide be sufficient in thickness to function as a conductive plate in the ultimate device and, for the purposes of the invention, the thickness of this layer may range from 250 A to 4,500 A. Following, diffusion of the deep center into the crystal is effected by heating the coated gallium arsenide in accordance with well-known procedures. The material found suitable for use herein in the generation of a deep center is chromium which may typically be heated to a temperature within the range of 850° to 900°C for a time period ranging from 1 to 16 hours. In order to assure the presence of the requisite conductive surface layer of chromium, the diffusion coefficient is measured as a function of temperature and the depth of penetration of the deep center (thickness of the semi-insulating layer) calculated by applying the standard equation for a complementary error function distribution. The resultant structure shown in FIG. 2 includes a semi-insulating layer 12 bearing a conducting surface coating of chromium 13, or a dispersion of conducting chromium in its own oxide.

At this point, it may be desirable to deposit a suitable mask upon the surface of the semi-insulating layer in the event that that material is so thin that subsequent diffusion of dopants into the n-type gallium arsenide will cause penetration into a multiplicity of areas. A suitable mask for this purpose could comprise silicon nitride or any other well-known diffusion mask.

Figure 3:
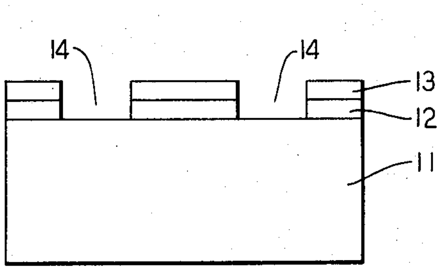
FIG. 3 is a cross-sectional view of the structure of FIG. 2 after the generation therein of a pair of windows.

The next step in the fabrication of a field effect structure involves generating a pair of windows or apertures in the semi-insulating layer bearing the surface coating of chromium. This end is typically effected by conventional photolithographic techniques wherein a photoresist is initially deposited upon the semi-insulating layer, exposed to a suitable light source, developed and etched. This end may also be attained by a standard back-sputtering technique. The resultant structure shown in FIG. 3 includes windows 14.

Figure 4:
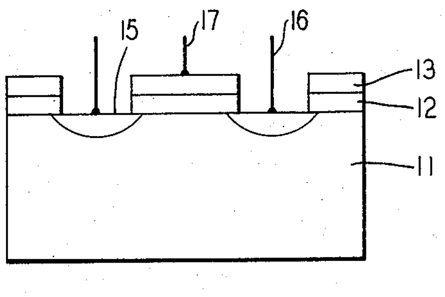
FIG. 4 is a cross-sectional view of the structure of FIG. 3 after the formation of a pair of contacts in the window area.

Finally, a pair of rectifying or ohmic contacts 15 are formed by introducing a p-type material or an n-type material, respectively, as a dopant into the gallium arsenide crystal through windows 14 by conventional techniques such as diffusion, alloying, ion implantation and the like. The last step involves connection of leads 16 (FIG. 4) to the contact regions and lead 17 to the field plate by conventional techniques. Thus, in the case of diffusion of a p-type material into the n-type gallium arsenide there is formed a well-known insulated gate field effect transistor configuration, whereas in the case of the diffusion of an n-type material into the n-type gallium arsenide there is formed a field effect structure of the transferred electron oscillator variety.

Figure 5:
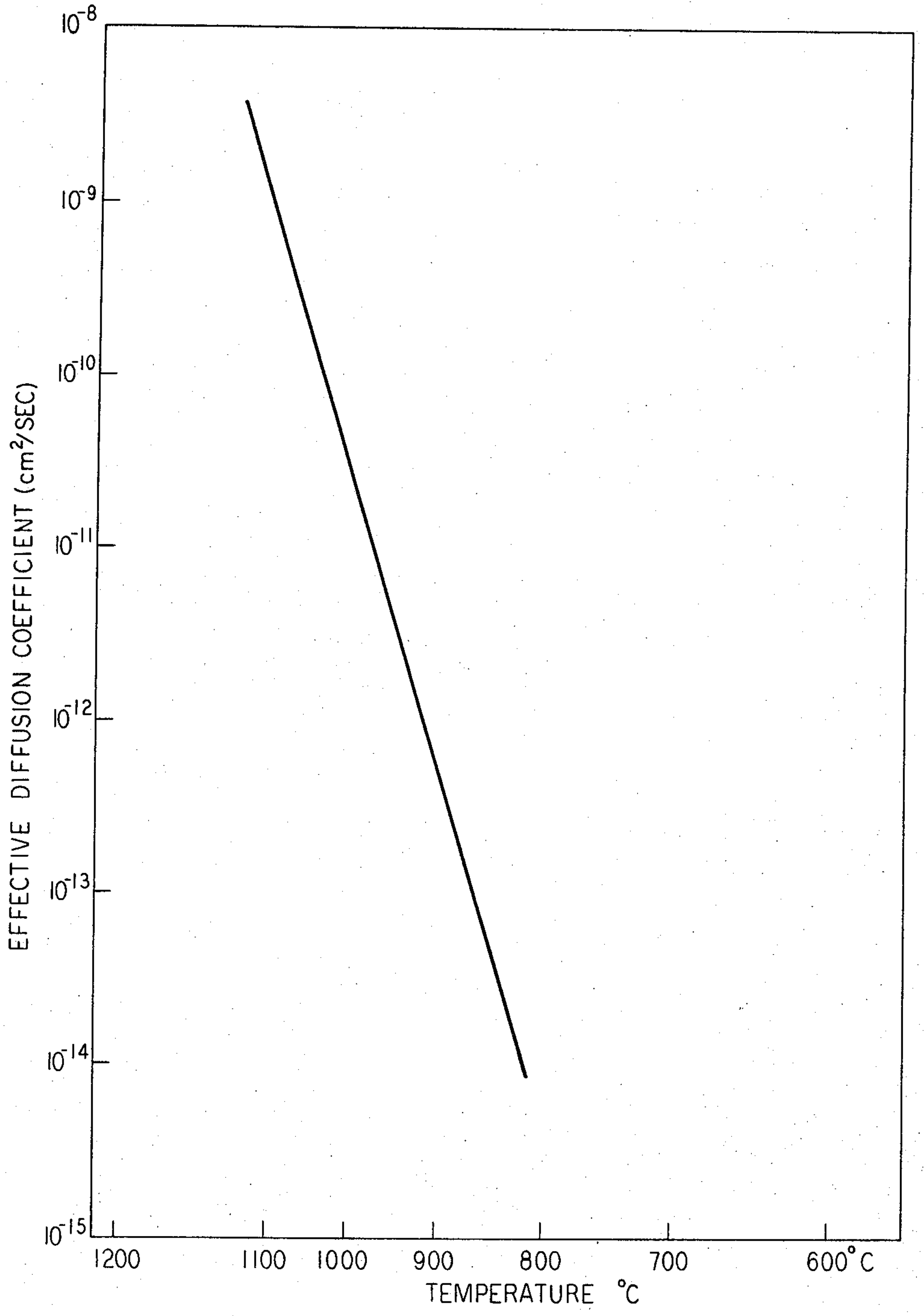
FIG. 5 is a graphical representation on coordinates of temperature in degrees centigrade against chromium diffusion coefficient in centimeters per square second showing variations in diffusion coefficient with variations in temperature.

With reference now to FIG. 5 there is shown a graphical representation on coordinates of temperature and degrees centigrade against diffusion coefficient for chromium in gallium arsenide. It will be noted that temperatures within the range prescribed herein (within the range of 850° to 900°C) will correspond with distribution coefficients from $10^{-13}$ to $10^{-12}$ square centimeters per second and the depth of penetration may be calculated in the manner set forth above.

Examples of the present invention are set forth below. They are intended merely to be illustrative in nature and it is to be appreciated that the processes described may be varied by one skilled in the art without departing from the spirit and scope of the invention.

EXAMPLE I

A sample of n-type gallium arsenide having a resistivity of one ohm-centimeter is obtained from commercial sources. The material so obtained is cut in slices 20 mils thick and lapped and polished to 15 mils, polishing being effected by standard chemical techniques. Next, chromium is electroplated from a 1 per cent solution of chromium in sulfuric acid upon the surface of a slice to a thickness of 2,000 A. Following, diffusion of the chromium into the gallium arsenide is effected by heating the structure to a temperature of 880°C for 16 hours, so resulting in the generation of deep centers in the gallium arsenide and the formation of a surface coating of chromium on the resultant semi-insulating layer of 500 A in thickness. Thereafter, a pair of windows are generated in the resultant semi-insulating film by depositing a conventional photo-resist thereon and exposing, developing and etching. Next, p-type regions are formed in the window areas by a standard diffusion technique utilizing ternary zinc sources as described in the literature. Finally, zinc doped gold wires are attached to the p-type regions and bonded thereto and gold wire is applied and bonded to the field plate. The resultant structure is an FET device and the application of a field to the chromium layer of the device results in the generation of conventional FET characteristics.

EXAMPLE II

The procedure of Example I is repeated with the exception that the material formed in the window areas by standard diffusion techniques is an n-type material provided from a tellurium doped source as described in the literature. Additionally, the leads applied to the diffusion formed n-type regions in the window areas are tin doped gold wires and the lead applied to the field gate is a gold wire. The resultant configuration is an FETEO structure and manifests characteristics indigenous to that device.

It will be understood by those skilled in the art that the inventive concept described herein may be employed with equivalent efficacy utilizing as the substrate material an epitaxial film of n-type gallium arsenide grown upon a semi-insulating substrate.

I claim:

1. Technique for the fabrication of a self-registered field effect structure which comprises the steps of:
   a. depositing a layer of chromium upon the surface of an N type gallium arsenide substrate,
   b. forming a semi-insulating layer in the resultant structure by diffusing a portion of said chromium layer into the gallium arsenide, a layer of chromium ranging in thickness from 250 to 4,500 A remaining upon the semi-insulating layer,
   c. generating a pair of windows in said semi-insulating layer and introducing identical materials selected from the group consisting of elements capable of generating a donor state and elements capable of generating an acceptor state through said windows into the exposed gallium arsenide, so resulting in the formation of N type of P type contact regions, respectively, and attaching electrical contact means to said contact regions and to said remaining chromium layer.

2. Technique in accordance with claim 1 wherein the thickness of said deposited chromium layer ranges from 1,000 to 5,000 A.

3. Technique in accordance with claim 1 wherein diffusion is effected by heating the structure to a temperature ranging from 850° to 900°C for a time period within the range of 1 to 16 hours.

* * * * *